(12) United States Patent
Johnson

(10) Patent No.: US 8,704,544 B2
(45) Date of Patent: *Apr. 22, 2014

(54) METHOD AND APPARATUS FOR MULTI-PLANAR EDGE-EXTENDED WAFER TRANSLATOR

(75) Inventor: Morgan T. Johnson, Portland, OR (US)

(73) Assignee: Advanced Inquiry Systems, Inc., Tigard, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/068,152

(22) Filed: Mar. 10, 2011

(65) Prior Publication Data

US 2012/0139575 A1    Jun. 7, 2012

Related U.S. Application Data

(63) Continuation of application No. 12/349,187, filed on Jan. 6, 2009, which is a continuation of application No. 11/811,874, filed on Jun. 11, 2007, now Pat. No. 7,532,022.

(60) Provisional application No. 60/812,156, filed on Jun. 9, 2006.

(51) Int. Cl.
*G01R 31/20* (2006.01)
*G01R 31/28* (2006.01)

(52) U.S. Cl.
CPC ........ *G01R 31/2884* (2013.01); *G01R 31/2855* (2013.01); *G01R 31/2853* (2013.01); *G01R 31/2851* (2013.01)
USPC .................................................... 324/754.03

(58) Field of Classification Search
None
See application file for complete search history.

(56) References Cited

U.S. PATENT DOCUMENTS

| | | | | |
|---|---|---|---|---|
| 4,912,399 | A | * | 3/1990 | Greub et al. .............. 324/755.09 |
| 4,975,638 | A | * | 12/1990 | Evans et al. .............. 324/754.14 |
| 5,422,574 | A | | 6/1995 | Kister |
| 5,433,563 | A | | 7/1995 | Velepec |
| 5,500,604 | A | | 3/1996 | Swarbrick et al. |
| 5,600,257 | A | | 2/1997 | Leas et al. |
| 6,005,401 | A | | 12/1999 | Nakata et al. |
| 6,097,199 | A | | 8/2000 | Jeng et al. |
| 6,100,709 | A | | 8/2000 | Marieb et al. |
| 6,181,145 | B1 | | 1/2001 | Tomita et al. |
| 6,297,658 | B1 | | 10/2001 | Nakata et al. |
| 6,359,456 | B1 | | 3/2002 | Hembree et al. |
| 6,433,563 | B1 | * | 8/2002 | Maruyama .............. 324/754.07 |
| 6,480,012 | B1 | | 11/2002 | Komori |
| 6,730,541 | B2 | | 5/2004 | Heinen et al. |

(Continued)

*Primary Examiner* — Paresh Patel
(74) *Attorney, Agent, or Firm* — Perkins Coie LLP

(57) ABSTRACT

An apparatus, suitable for coupling a pads of integrated circuits on wafer to the pogo pins of a pogo tower in a test system without the need of a probe card, includes a body having a first surface and a second surface, the body having a substantially circular central portion, and a plurality of bendable arms extending outwardly from the central portion, each bendable arm having a connector tab disposed at the distal end thereof; a first plurality of contact terminals disposed on the second surface of the central portion of the body, the first plurality of contact terminals arranged in pattern to match the layout of pads on a wafer to be contacted; at least one contact terminal disposed on the first surface of the plurality of connector tabs; and a plurality of electrically conductive pathways disposed in the body such that each of the first plurality of contact terminals is electrically connected to a corresponding one of the contact terminals on the first surface of the connector tabs.

12 Claims, 8 Drawing Sheets

(56) References Cited

U.S. PATENT DOCUMENTS

| | | |
|---|---|---|
| 6,744,267 B2 | 6/2004 | Sauk et al. |
| 6,798,224 B1 | 9/2004 | Hembree et al. |
| 6,853,205 B1 | 2/2005 | Cheng et al. |
| 6,911,835 B2 | 6/2005 | Chraft et al. |
| 6,965,244 B2 * | 11/2005 | Miller .................. 324/754.14 |
| 6,991,969 B2 | 1/2006 | Johnson |
| 7,116,124 B2 | 10/2006 | Byrd |
| 7,282,931 B2 | 10/2007 | Johnson |
| 7,456,643 B2 | 11/2008 | Johnson |
| 7,532,022 B2 * | 5/2009 | Johnson .................. 324/754.03 |
| 7,572,132 B2 | 8/2009 | Johnson et al. |
| 7,638,366 B2 | 12/2009 | Johnson |
| 7,960,986 B2 | 6/2011 | Johnson |
| 2010/0001749 A1 | 1/2010 | Johnson |
| 2012/0112778 A1 | 5/2012 | Johnson |

* cited by examiner

METHOD AND APPARATUS FOR MULTI-PLANAR EDGE-EXTENDED WAFER TRANSLATOR

CROSS-REFERENCE TO RELATED APPLICATION

This non provisional application is a continuation of U.S. patent application Ser. No. 12/349,187, filed Jan. 6, 2009, titled "Method and Apparatus for Multi-Planar Edge-Extended Wafer Translator," which is a continuation of non-provisional application Ser. No. 11/811,874, filed 11 Jun. 2007, and entitled "Method and Apparatus For Fixed-Form Multi-Planar Extension of Electrical Conductors Beyond The Margins Of A Substrate," which claimed the benefit of provisional application 60/812,156, file 9 Jun. 2006, and entitled "Methods And Apparatus For Fixed-Form Multi-Planar Extension of Electrical Conductors Beyond The Margins Of A Substrate," the entirety of each of which are hereby incorporated by reference.

FIELD OF THE INVENTION

The present invention relates generally to semiconductor test equipment, and more particularly relates to methods and apparatus for routing electrical conductors to and from integrated circuits, microelectromechanical devices (MEMs), or similar structures in a test environment.

BACKGROUND

Advances in semiconductor manufacturing technology have resulted in, among other things, reducing the cost of sophisticated electronics to the extent that integrated circuits have become ubiquitous in the modern environment.

As is well-known, integrated circuits are typically manufactured in batches, and these batches usually contain a plurality of semiconductor wafers within and upon which integrated circuits are formed through a variety of semiconductor manufacturing steps, including, for example, depositing, masking, patterning, implanting, etching, and so on.

Completed wafers are tested to determine which die, or integrated circuits, on the wafer are capable of operating according to predetermined specifications. In this way, integrated circuits that cannot perform as desired are not packaged, or otherwise incorporated into finished products.

It is common to manufacture integrated circuits on roughly circular semiconductor substrates, or wafers. Further, it is common to form such integrated circuits so that conductive regions disposed on, or close to, the uppermost layers of the integrated circuits are available to act as terminals for connection to various electrical elements disposed in, or on, the lower layers of those integrated circuits. In testing, these conductive regions are commonly contacted with a probe card.

The maintenance of probe tip accuracy, good signal integrity, and overall dimensional accuracy severely strains even the best of these highly developed fabrication methods because of the multiple component and assembly error budget entries.

What is needed are lower-cost, less-complex apparatus and methods to increase test efficiency.

SUMMARY OF THE INVENTION

Briefly, an apparatus, suitable for coupling a pads of integrated circuits on wafer to the pogo pins of a pogo tower in a test system without the need of a probe card, includes a body having a first surface and a second surface, the body having a substantially circular central portion, and a plurality of bendable arms extending outwardly from the central portion, each bendable arm having a connector tab disposed at the distal end thereof; a first plurality of contact terminals disposed on the second surface of the central portion of the body, the first plurality of contact terminals arranged in pattern to match the layout of pads on a wafer to be contacted; at least one contact terminal disposed on the first surface of the plurality of connector tabs; and a plurality of electrically conductive pathways disposed in the body such that each of the first plurality of contact terminals is electrically connected to a corresponding one of the contact terminals on the first surface of the connector tabs.

DETAILED DESCRIPTION

Figure 1:
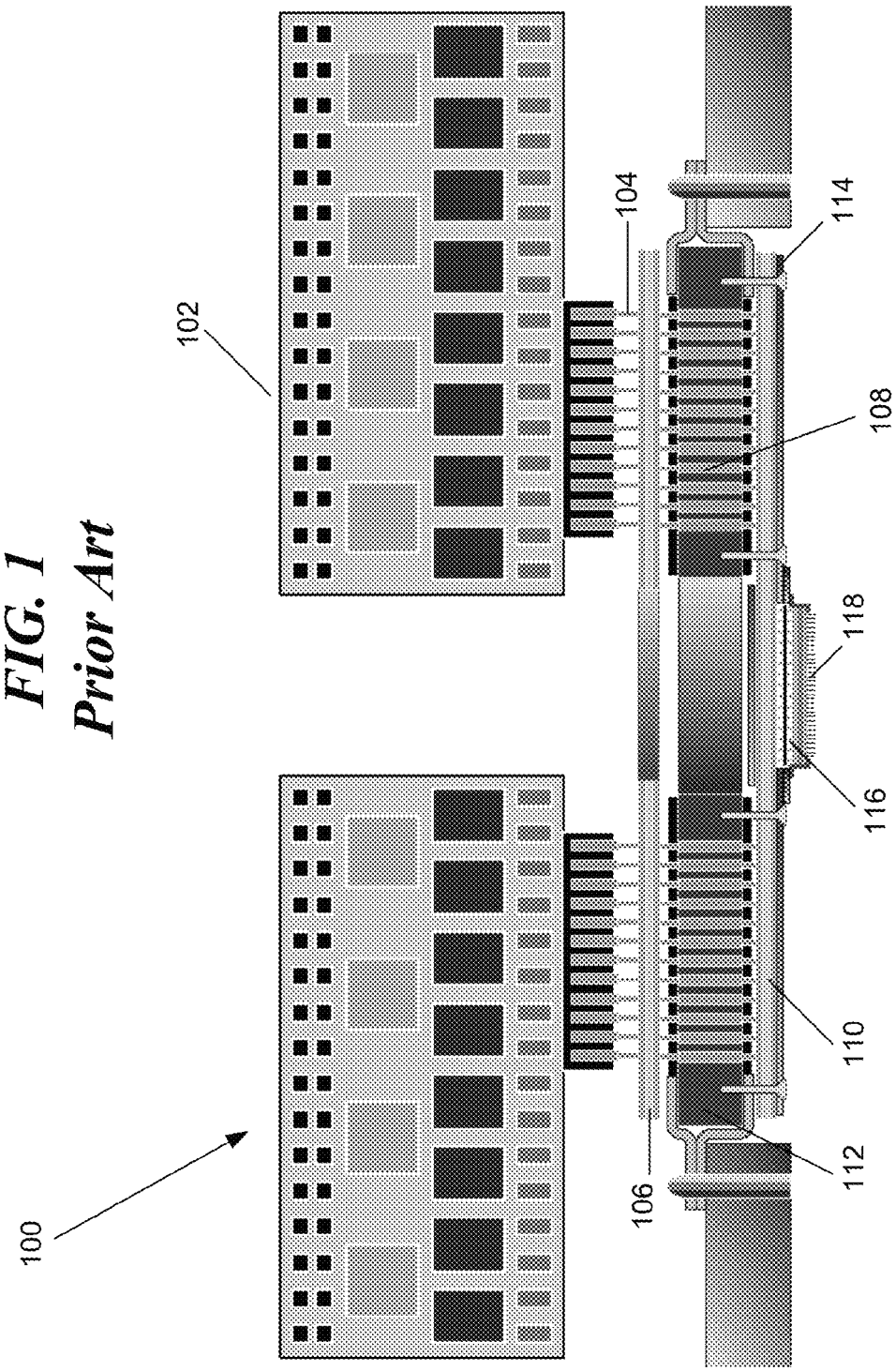
FIG. 1 is a cross-sectional representation of a common probe card/test head configuration.

Generally, an apparatus provides electrical pathways between pads of unsingulated integrated circuits and pogo pins disposed in a pogo tower of a semiconductor test system without the need of a probe card.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

Reference herein to "circuit boards", unless otherwise noted, is intended to include any type of substrate upon which circuits may be placed. For example, such substrates may be rigid or flexible, ceramic, flex, epoxy, FR4, or any other suitable material.

Pad refers to a metallized region of the surface of an integrated circuit, which is used to form a physical connection terminal for communicating signals to and/or from the integrated circuit.

The expression "wafer translator" refers to an apparatus facilitating the connection of pads (sometimes referred to as terminals, I/O pads, contact pads, bond pads, bonding pads, chip pads, test pads, or similar formulations) of unsingulated integrated circuits, to other electrical components. It will be appreciated that "I/O pads" is a general term, and that the present invention is not limited with regard to whether a particular pad of an integrated circuit is part of an input, output, or input/output circuit. A wafer translator is typically disposed between a wafer and other electrical components, and/or electrical connection pathways. The wafer translator is typically removably attached to the wafer (alternatively the wafer is removably attached to the translator). The wafer translator includes a substrate having two major surfaces, each surface having terminals disposed thereon, and electrical pathways disposed through the substrate to provide for electrical continuity between at least one terminal on a first surface and at least one terminal on a second surface. The wafer-side of the wafer translator has a pattern of terminals that matches the layout of at least a portion of the pads of the integrated circuits on the wafer. The wafer translator, when disposed between a wafer and other electrical components such as an inquiry system interface, makes electrical contact with one or more pads of a plurality of integrated circuits on the wafer, providing an electrical pathway therethrough to the other electrical components. The wafer translator is a structure that is used to achieve electrical connection between one or more electrical terminals that have been fabricated at a first scale, or dimension, and a corresponding set of electrical terminals that have been fabricated at a second scale, or dimension. The wafer translator provides an electrical bridge between the smallest features in one technology (e.g., pins of a probe card) and the largest features in another technology (e.g., bonding pads of an integrated circuit). For convenience, wafer translator is referred to simply as translator where there is no ambiguity as to its intended meaning. In some embodiments a flexible wafer translator offers compliance to the surface of a wafer mounted on a rigid support, while in other embodiments, a wafer offers compliance to a rigid wafer translator. The surface of the translator that is configured to face the wafer in operation is referred to as the wafer-side of the translator. The surface of the translator that is configured to face away from the wafer is referred to as the inquiry-side of the translator. An alternative expression for inquiry-side is tester-side.

The expression "edge extended wafer translator" refers to an embodiment of a translator in which electrical pathways disposed in and/or on the translator lead from terminals, which in use contact the wafer under test, to electrical terminals disposed outside of a circumferential edge of a wafer aligned for connection with, or attached to the edge extended translator.

The expression "translated wafer" refers to a wafer that has a wafer translator attached thereto, wherein a predetermined portion of, or all of, the contact pads of the integrated circuits on the wafer are in electrical contact with corresponding electrical connection means disposed on, the wafer side of the translator. Typically, the wafer translator is removably attached to the wafer. Removable attachment may be achieved, for example, by means of vacuum, or pressure differential, attachment.

The terms die, chip, integrated circuit, semiconductor device, and microelectronic device are sometimes used interchangeably in this field. The present invention relates to the manufacture and test of chips, integrated circuits, semiconductor devices and microelectronic devices as these terms are commonly understood in the field.

FIG. 1 is a cross-sectional representation of a common probe card/test head configuration 100. Test head pin electronics board 102 with attached pogo pin interface 104 contacts load board 106. Double ended pogo pins 108 housed in pogo tower 112 contact the lowermost surface of load board 106 and the uppermost surface of probe card 110. Metal reinforcement, or "spider," 114 attaches probe card 110 to pogo tower 112. Connector 116 provides electrical contact between probe card 110 and probe points 118, which are available to contact a device under test (DUT).

Figure 2:
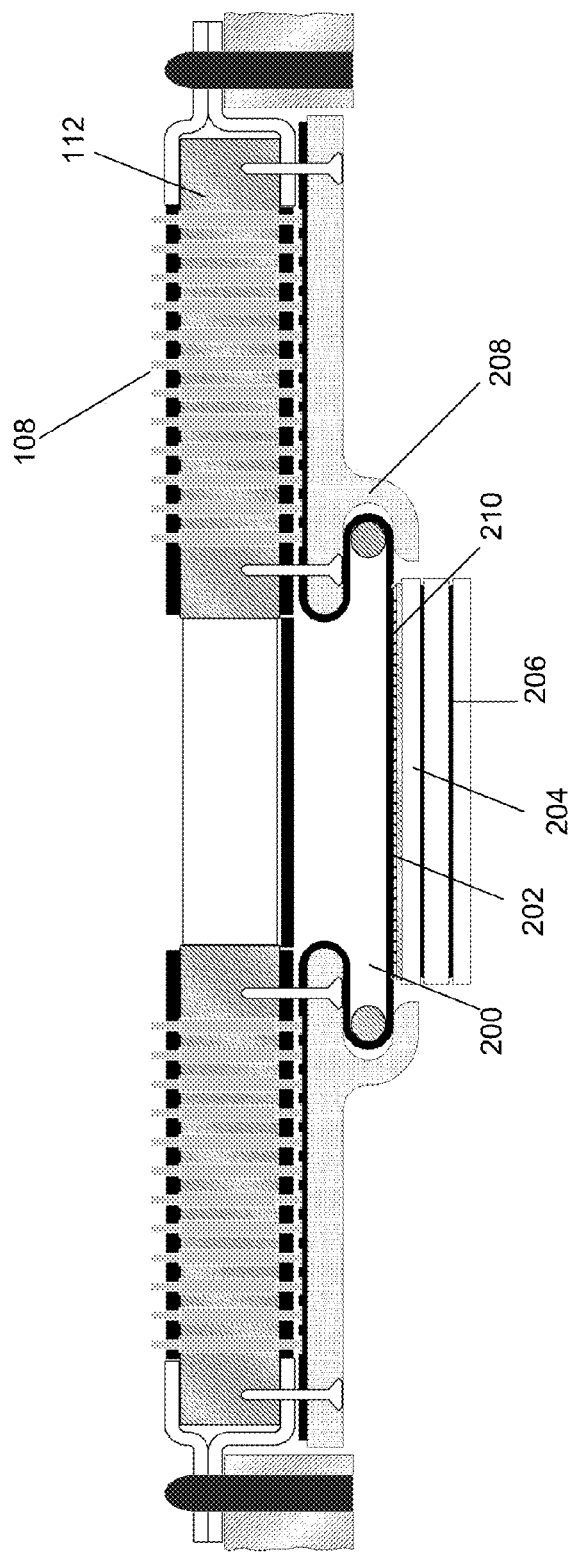
FIG. 2 is a cross-sectional representation of a fixed form, multi-planar edge-extended wafer translator, mounted for use within a test assembly.

FIG. 2 is a cross-sectional representation of an embodiment of a fixed form, multi-planar edge extended wafer translator 200, connected to pogo tower 112 within a test assembly. Fixed form, multi-planar edge extended wafer translator 200 is bent to conform to the profile of metal reinforcing fixture 208. Reinforcing fixture 208 brings the extended edge of fixed form, multi-planar edge extended wafer translator 200 into contact with pogo pins 108. Wafer 204 is mounted on wafer chuck 206. The uppermost surface of wafer 204 is brought into contact with probe point array 202, on the wafer-side of fixed form, multi-planar edge-extended wafer translator 200, by means of a pressure differential between a space between the wafer and wafer-side of wafer translator 200, and the atmosphere outside that space. In some embodiments, a gasket 210 is disposed between wafer translator 200 and wafer 204. In some embodiments, a groove is provided in wafer translator 200 to receive an O-ring, and the O-ring serves to form a substantially gas-tight seal between the wafer and the wafer translator when the two are pressed into contact.

Figure 3:
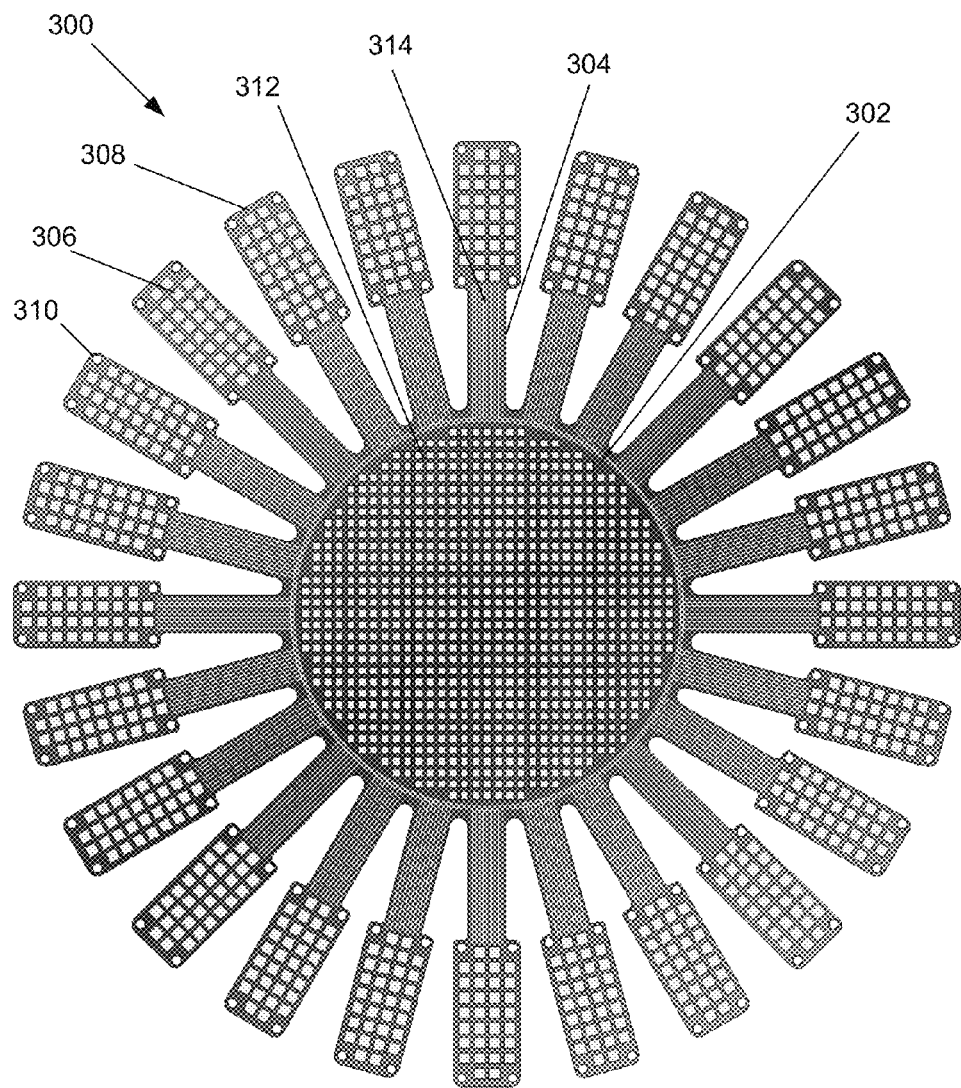
FIG. 3 is a top-view representation of an embodiment of a fixed form, multi-planar edge-extended wafer translator prior to bending.

FIG. 3 is a top-view representation of a fixed form, multi-planar edge-extended wafer translator 300 prior to bending. Bendable arms 304, printed with wire paths 314, provide electrical connections to and from wafer translator 302, and to and from connector tabs 308. The bendable arms may be referred to as bendable connectors, or flexible arms. Perforations 310 in connector tabs 308 provide for mechanical alignment and attachment to a mounting fixture as pictured in FIGS. 1 and 2. A plurality of electrically conductive pads 306 are disposed on connector tabs 308. A plurality of conductive pads 312 are disposed on the upper surface of translator 302.

Figure 4:
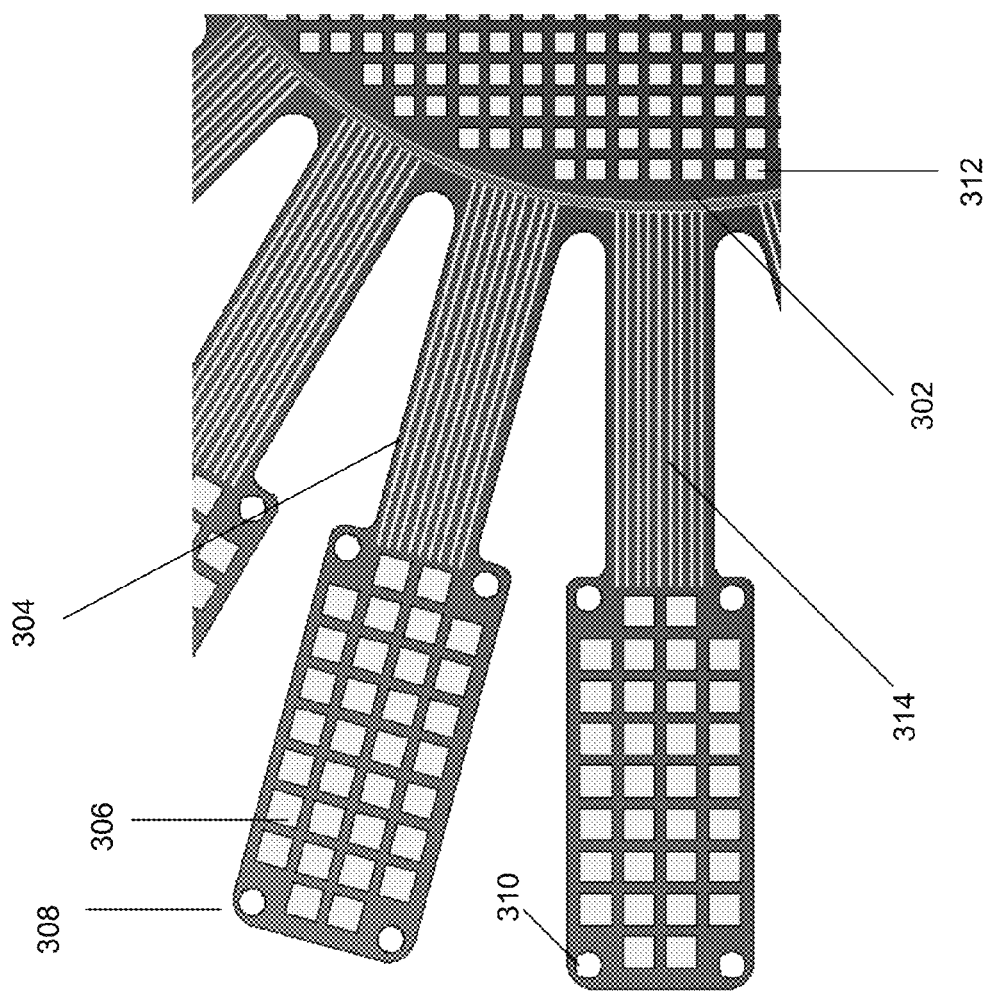
FIG. 4 is a close-in top view of a section of a fixed form, multi-planar edge-extended wafer translator prior to bending.

FIG. 4 is a close-in top view of a section of a fixed form, multi-planar edge extended wafer translator in accordance with the present invention. Perforations 310 in connector tabs 308 allow for alignment and attachment to a mounting fixture (as pictured in FIGS. 1 and 2). Perforations may also be referred to as holes. A plurality of electrically conductive pads 306 are disposed on the surface of connector tab 308. In this embodiment, wire paths 314 printed on bendable connectors arms 304 convey signals between conductive pads 306 and pads disposed on the underside of translator 302 (as pictured in FIGS. 1 and 2). A plurality of electrically conductive pads 312 are disposed on the surface of translator 302, and electrically connected to a plurality of conductive pads on the underside of translator 302 by wire paths disposed within translator 302.

Figure 5:
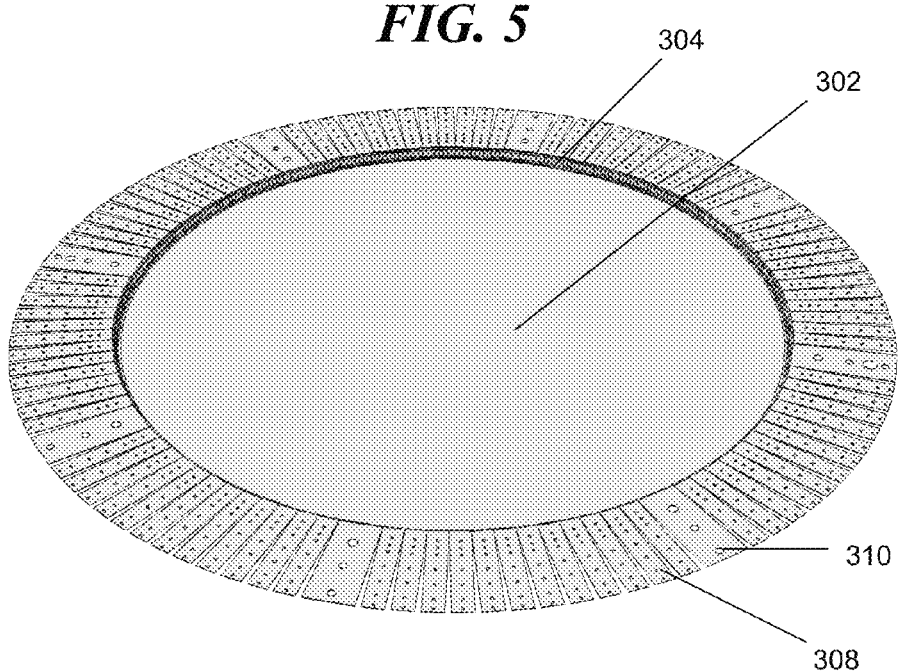
FIG. 5 is a three-dimensional representation of an embodiment of a fixed form, multi-planar edge-extended wafer translator bent to conform to a metal reinforcing structure, viewed from above.

FIG. 5 is a three-dimensional representation of another embodiment of a fixed form, multi-planar (FFMP) edge extended wafer translator bent to conform to a metal reinforcing structure, viewed from above. FIG. 5 shows a central portion that acts as a wafer translator 302, bendable arms 304, connector tabs 308 and perforations 310. It is noted that the present invention may be implemented as a central wafer translator with bendable arms attached to the central wafer translator and extending outwardly therefrom, and connector tabs attached to the distal ends of the bendable arms. Alternatively, the present invention may be implemented as a unitary body.

Figure 6:
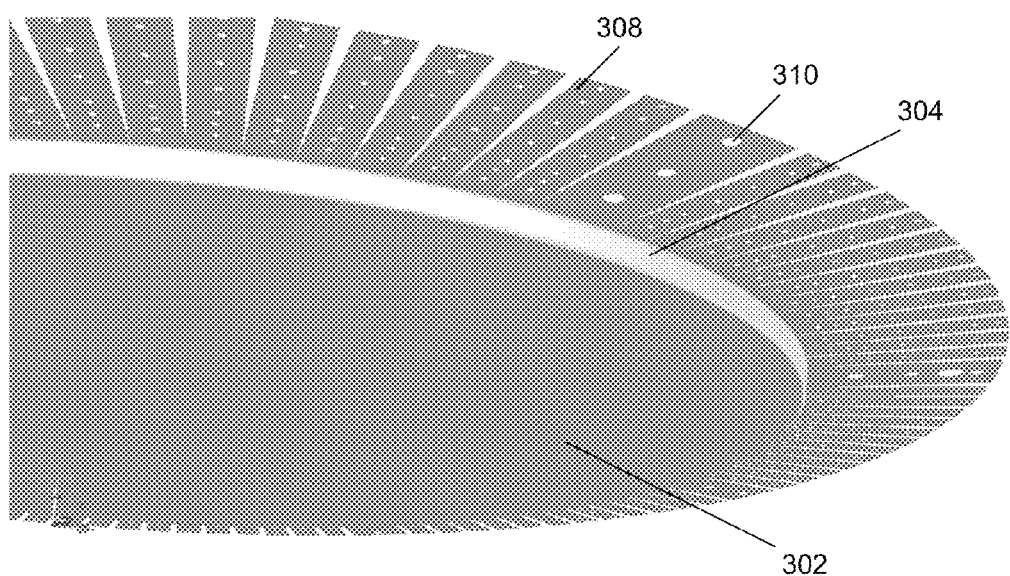
FIG. 6 is a sectional three-dimensional representation of an embodiment of a fixed form, multi-planar edge-extended wafer translator bent to conform to a metal reinforcing structure, viewed from below.

FIG. 6 is a sectional three-dimensional representation of the embodiment of an FFMP translator, shown in FIG. 5, viewed from below. The representation includes a wafer translator 302, bendable arms 304, connector tabs 308 and perforations 310.

Figure 7:
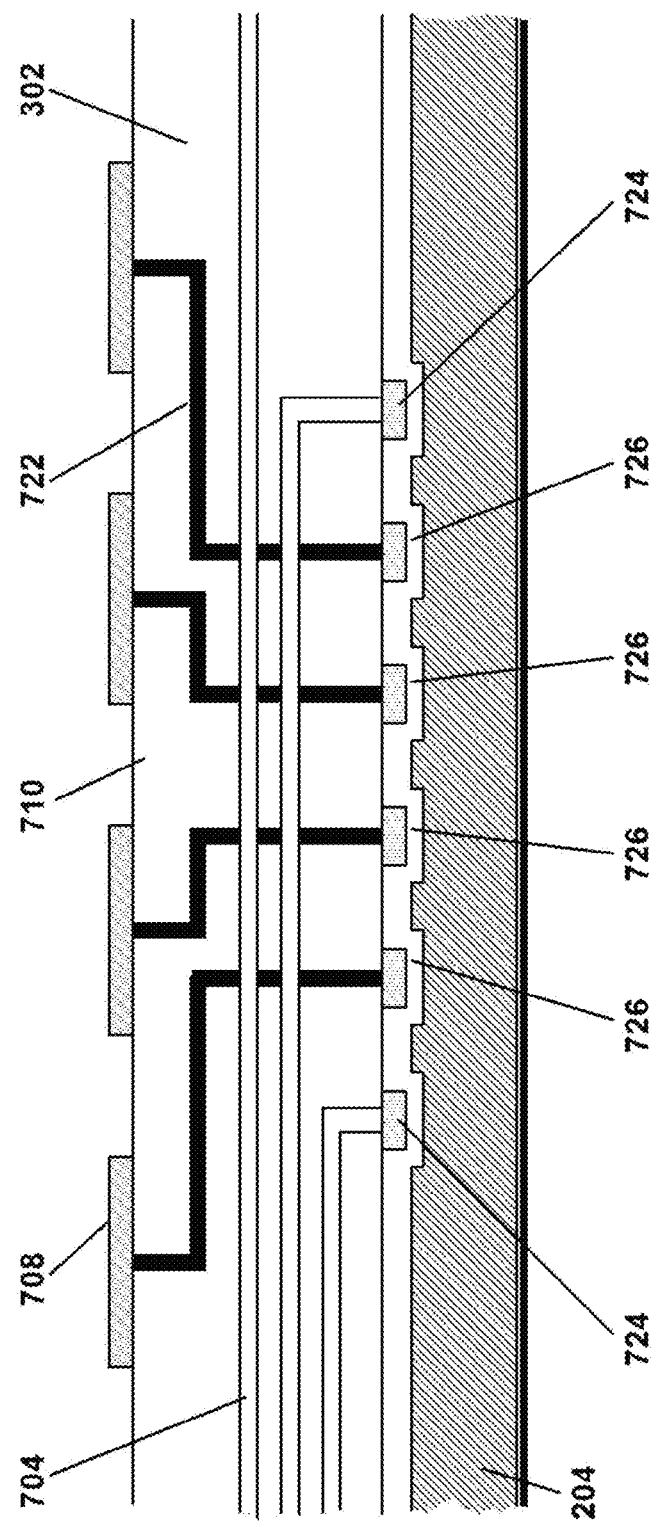
FIG. 7 is a cross-sectional representation of a segment of a wafer in contact with a fixed form, multi-planar edge-extended wafer translator, indicating the disposition of wire paths.

FIG. 7 is a cross-sectional representation of a segment of a wafer 204 in contact with a wafer translator 302, indicating the disposition of wire paths 722 and 704 in an embodiment of an FFMP translator. In this embodiment, pads 726, disposed on the underside of translator 302, are connected to pads 708 on the upper surface of translator 302 by wire paths 722. Pads 724, disposed on the underside of translator 302, contacted by wire paths 704, which may conduct signals to and from electrically conductive pads disposed beyond the circumferential margin of wafer 114, as seen in FIGS. 2-7.

Figure 8:
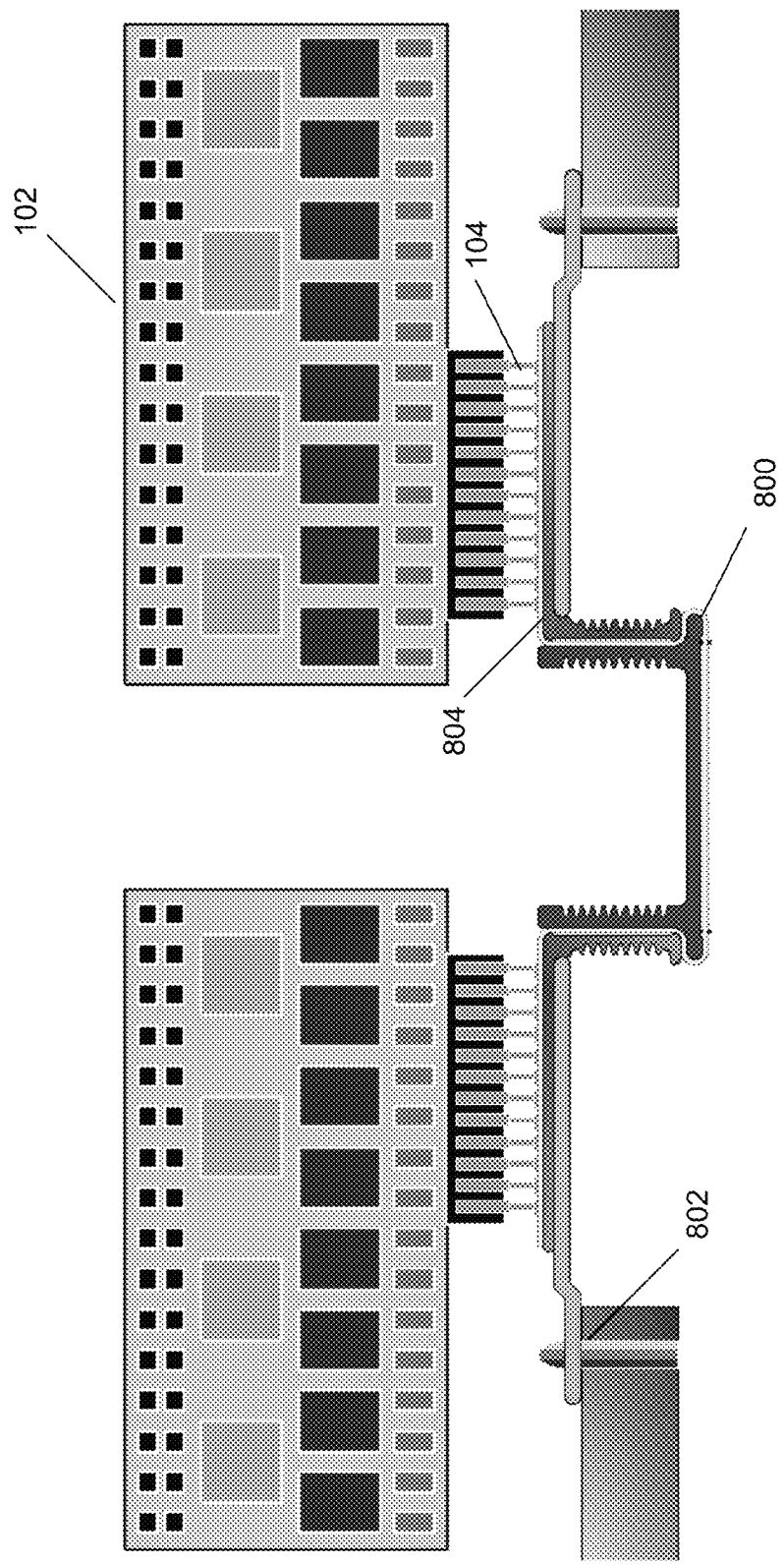
FIG. 8 is a cross-sectional representation of an alternative embodiment of a fixed form, multi-planar edge-extended wafer translator.

FIG. 8 is a cross sectional representation of an alternative embodiment of an FFMP translator 800 and mounting fixture 802 in contact with a test head pin electronics board 102 with attached pogo pin interface 104. In this embodiment, electrically conductive pads 804 disposed on the extended edge of FFMP translator 800 directly contact the pin electronics' pogo pins without an intervening pogo tower.

Figure 9:
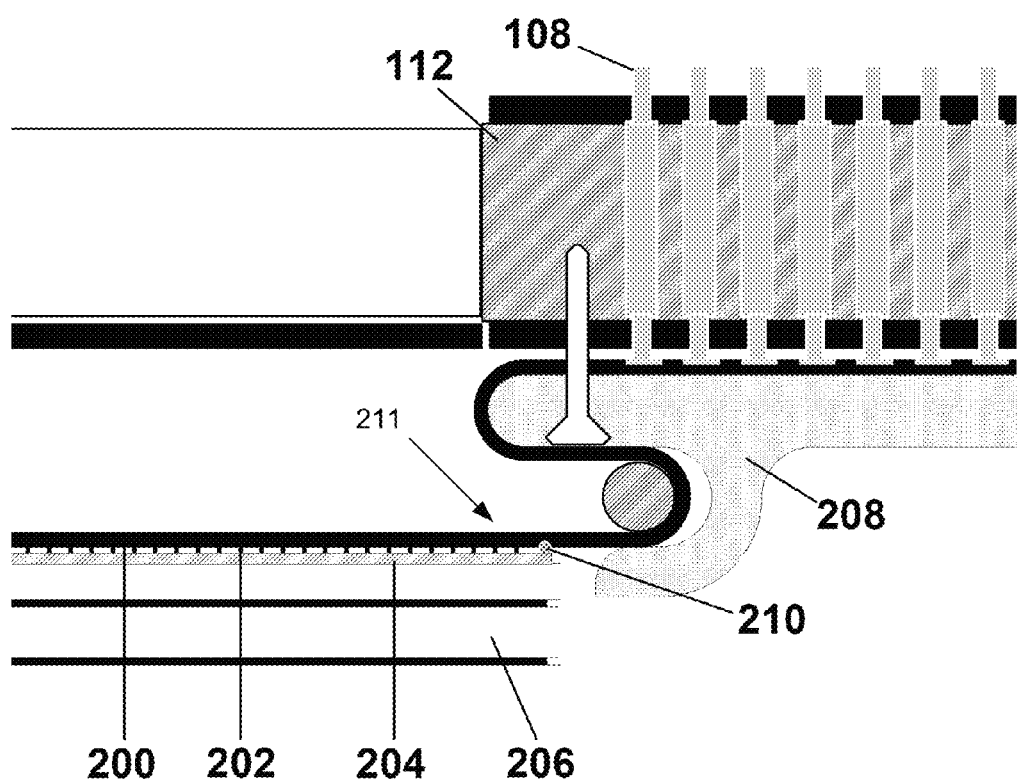
FIG. 9 is a cross-sectional representation of a portion of the multi-planar edge-extended wafer translator having a groove disposed in the wafer-side thereof, and a gasket disposed in the groove.

FIG. 9 is a cross-sectional representation of a portion of the multi-planar edge-extended wafer translator having a groove disposed in the wafer-side thereof, and a gasket disposed in the groove. The edge-extended wafer translator 200 is connected to pogo tower 112 within a test assembly. Fixed form, multi-planar edge extended wafer translator 200 is bent to conform to the profile of metal reinforcing fixture 208. Reinforcing fixture 208 brings the extended edge of the edge-extended wafer translator 200 into contact with pogo pins 108. Wafer 204 is mounted on wafer chuck 206. The uppermost surface of wafer 204 is brought into contact with probe point array 202, on the wafer-side of the edge-extended wafer translator 200, by means of a pressure differential between a space between the wafer and wafer-side of wafer translator 200, and the atmosphere outside that space. In some embodiments, a gasket 210 is disposed between wafer translator 200 and wafer 204. In some embodiments, a groove 211 is provided in wafer translator 200 to receive a gasket such as an O-ring, and the O-ring serves to form a substantially gas-tight seal between the wafer 204 and the wafer translator 200 when the two are removably attached.

The edge-extended wafer translator, as illustrated in FIGS. 2-9, provides the electrical interface between the translated wafer and a test system (not shown). Such a test system may provide power and signals to the device under test, and may further receive signals from the device under test. Such a system may alternatively serve to plug a wafer full of processors into a computer system; mesh routing may be facilitated by edge-extended wafer translators.

It will be appreciated that the ability to lead contact arrays off the wafer in various configurations allows for a range of alternative embodiments beyond those represented in FIGS. 2-9.

In one embodiment, an apparatus includes a body having a first surface and a second surface, the body having a substantially circular central portion, and a plurality of bendable arms extending outwardly from the central portion, each bendable arm having a connector tab disposed at the distal end thereof; a first plurality of contact terminals disposed on the second surface of the central portion of the body, the first plurality of contact terminals arranged in pattern to match the layout of pads on a wafer to be contacted; at least one contact terminal disposed on the first surface of the plurality of connector tabs; and a plurality of electrically conductive pathways disposed in the body such that each of the first plurality of contact terminals is electrically connected to a corresponding one of the contact terminals on the first surface of the connector tabs.

Conclusion

The exemplary methods and apparatus illustrated and described herein find application in the field of integrated circuit test and analysis.

It is to be understood that the present invention is not limited to the embodiments described above, but encompasses any and all embodiments within the scope of the subjoined Claims and their equivalents.

What is claimed is:

1. An apparatus, comprising;
a generally circular body having a first surface facing a first direction and a second surface facing a second direction opposite from the first direction, the body having a substantially circular central portion, and a plurality of bendable arms attached to the central portion in a circular arrangement and extending radially outwardly from the central portion, each bendable arm having a connector tab disposed at a distal end thereof;
a plurality of first contact terminals carried by the central portion of the body and facing the second direction, the first plurality of contact terminals arranged in a pattern to match a layout of a first plurality of pads across a wafer to be contacted, and operable to simultaneously provide electrical connection to the corresponding first plurality of pads;
a plurality of second contact terminals facing the first direction, with individual second contact terminals carried by individual connector tabs;
a plurality of electrically conductive pathways carried by the body to electrically connect corresponding first and second contact terminals on the first surface of the connector tabs; and
wherein the substantially circular central portion of the body is removably attachable to the wafer; wherein the substantially circular central portion of the body has an area that substantially matches the area of the wafer; and wherein the plurality of bendable arms extending radially outwardly from the central portion provide electrical pathways that extend beyond- a circumferential edge of the wafer.

2. The apparatus of claim 1, wherein each connector tab has at least one perforation therein, 3. The apparatus of claim 1, wherein the body is a unitary structure 4. The apparatus of claim 1, wherein the connector tabs of the bendable arms are in a plane that is different from the plane in which the central portion is.

5. The apparatus of claim 4, further comprising:
a fixture adapted to receive and mechanically couple with a pogo tower;
wherein at least a portion of the fixture is mechanically coupled to the plurality of bendable arms.

6. The apparatus of claim 5, wherein the pogo tower includes a plurality of pogo pins; and wherein each contact terminal carried by the first surface of the connector tabs is in electrical contact with a corresponding pogo pin.

7. The apparatus of claim 1, wherein at least one perforation is provided in at least one of the connector tabs.

8. The apparatus of claim 1, wherein the plurality of bendable arms includes at least three bendable arms extending radially outwardly from the circular central portion.

9. An apparatus, comprising:
a generally circular body having a first surface facing a first direction and a second surface facing a second direction opposite from the first direction, the body having a substantially circular central portion, and at least three independently bendable arms in a circular arrangement, the bendable arms extending radially from the central portion, each one of the bendable arms having a connector tab disposed toward a distal end thereof;
a plurality of first contact terminals carded by the second surface of the central portion of the body, the first plurality of contact terminals arranged in a pattern corresponding to a layout of a first plurality of pads across a wafer to be contacted, and operable to electrically contact the corresponding first plurality of pads;
plurality of the second contact terminals carried by the first surface of the plurality of connector tabs;
a plurality of electrically conductive pathways electrically connecting the first and the second pluralities of contact terminals;
a fixture adapted to receive and mechanically couple with a pogo tower;
wherein at least a portion of the fixture is mechanically coupled to at least one of the bendable arms;
wherein the substantially circular central portion of the body is removably attachable to the wafer;
wherein the substantially circular central portion of the body has an area that substantially matches the area of the wafer; and
wherein the bendable arms extending radially from the central portion provide electrical pathways that extend beyond a circumferential edge of the wafer.

10. The apparatus of claim 9, wherein the connector tabs of the bendable arms are in a plane that is different from the plane in which the central portion is.

11. The apparatus of claim 1 wherein different connector tabs are disposed at generally same distance from a center of the circulation central portion.

12. The apparatus of claim 1, wherein the distal ends of the bendable arms are separated.

* * * * *